United States Patent
Oh et al.

(10) Patent No.: US 10,636,888 B2
(45) Date of Patent: Apr. 28, 2020

(54) THIN FILM TRANSISTOR AND BACKPLANE SUBSTRATE OF A DISPLAY DEVICE INCLUDING THE SAME

(71) Applicant: LG Display Co., Ltd., Seoul (KR)

(72) Inventors: Kum-Mi Oh, Seoul (KR); Hye-Seon Eom, Daegu (KR); Shun-Young Yang, Gyeonggi-do (KR); Jeoung-In Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/154,400

(22) Filed: May 13, 2016

(65) Prior Publication Data

US 2016/0336419 A1 Nov. 17, 2016

(30) Foreign Application Priority Data

May 14, 2015 (KR) .......................... 10-2015-0067321

(51) Int. Cl.
*H01L 29/423* (2006.01)
*H01L 27/12* (2006.01)
*H01L 29/786* (2006.01)

(52) U.S. Cl.
CPC .... *H01L 29/42384* (2013.01); *H01L 27/1222* (2013.01); *H01L 27/1285* (2013.01); *H01L 29/78678* (2013.01); *H01L 29/78696* (2013.01)

(58) Field of Classification Search
CPC .. A61K 36/28; A61K 36/515; A61K 36/9068; A61K 9/1652; H01L 27/1222; H01L 27/1285; H01L 29/42384; H01L 29/78678; H01L 29/78696
USPC ........................................ 257/40, 57, 59, 66
See application file for complete search history.

(56) References Cited

U.S. PATENT DOCUMENTS

| | | | |
|---|---|---|---|
| 5,811,835 A | * | 9/1998 | Seiki ................. H01L 29/42384 257/57 |
| 6,133,074 A | | 10/2000 | Ishida et al. |
| 6,198,132 B1 | | 3/2001 | Ishida et al. |
| 6,215,154 B1 | | 4/2001 | Ishida et al. |

(Continued)

FOREIGN PATENT DOCUMENTS

| CN | 1591146 A | 3/2005 |
|---|---|---|
| CN | 1716065 A | 1/2006 |

(Continued)

OTHER PUBLICATIONS

Japanese Office Action, dated Jul. 13, 2017, for the counterpart Japanese patent application No. 2016-097712.
Japanese Office Action dated Feb. 8, 2018 in the counterpart Japanese Patent Application No. 2016-097712.
Ohinese Office Action, dated Sep. 4, 2018, for the counterpart Chinese patent application No. 201610323725.3.

(Continued)

*Primary Examiner* — Mohammed Shamsuzzaman
(74) *Attorney, Agent, or Firm* — Morgan, Lewis & Bockius LLP

(57) ABSTRACT

A thin film transistor includes a gate electrode on a substrate. The gate electrode includes a flat portion and an inclined portion at a side of the flat portion. A ratio of a height to a width (height/width) of the inclined portion is 1.192 or less. The thin film transistor also includes a gate insulating layer disposed on the substrate to cover the gate electrode and a polysilicon active layer on the gate insulating layer and over the gate electrode. The thin film transistor further includes a source electrode and a drain electrode respectively connected to two opposite end portions of the polysilicon active layer.

15 Claims, 12 Drawing Sheets

(56) References Cited

U.S. PATENT DOCUMENTS

| | | | |
|---|---|---|---|
| 6,235,561 | B1 | 5/2001 | Seiki et al. |
| 6,808,963 | B2 | 10/2004 | Ishida et al. |
| 6,909,114 | B1* | 6/2005 | Yamazaki ......... H01L 21/28114 |
| | | | 257/344 |
| 7,026,649 | B2 | 4/2006 | Kang et al. |
| 8,023,086 | B2 | 9/2011 | Hwang et al. |
| 9,045,831 | B2* | 6/2015 | Suzawa ................. C23F 4/00 |
| 9,466,726 | B2* | 10/2016 | Yamazaki ......... H01L 29/41733 |
| 2001/0000620 | A1* | 5/2001 | Ishida ................ H01L 21/268 |
| | | | 257/59 |
| 2004/0004220 | A1* | 1/2004 | Suzuki ............. H01L 29/42384 |
| | | | 257/66 |
| 2005/0045887 | A1 | 3/2005 | Kang et al. |
| 2006/0001791 | A1* | 1/2006 | Hwang ................ G02F 1/1345 |
| | | | 349/46 |
| 2011/0156025 | A1 | 6/2011 | Shionoiri et al. |
| 2013/0037814 | A1* | 2/2013 | Oh .................... H01L 21/28008 |
| | | | 257/59 |
| 2014/0103340 | A1* | 4/2014 | Yamazaki ........... H01L 29/7869 |
| | | | 257/43 |

FOREIGN PATENT DOCUMENTS

| | | |
|---|---|---|
| CN | 1287468 C | 11/2006 |
| CN | 102656691 A | 9/2012 |
| CN | 104157699 A | 11/2014 |
| JP | H0964366 A | 3/1997 |
| JP | H10229197 A | 8/1998 |
| JP | H10240150 A | 9/1998 |
| JP | H10319441 A | 12/1998 |
| JP | H11111997 A | 4/1999 |
| JP | 2000340801 A | 12/2000 |
| JP | 2001068680 A | 3/2001 |
| JP | 2004031409 A | 1/2004 |
| JP | 2007294672 A | 11/2007 |

OTHER PUBLICATIONS

Chinese Office Action dated May 7, 2019, in the counterpart Chinese Patent Application No. 2016-103237253. Note: CN 1716065 cited therein is already of record.

* cited by examiner

POLYSILICON REMAINED
ON INCLINED PORTION

THIN FILM TRANSISTOR AND BACKPLANE SUBSTRATE OF A DISPLAY DEVICE INCLUDING THE SAME

This application claims the benefit of Korean Patent Application No. 10-2015-0067321, filed on May 14, 2015, which is hereby incorporated by reference as if fully set forth herein.

BACKGROUND OF THE INVENTION

Field of the Invention

The present invention relates to a thin film transistor, and more particularly, to a thin film transistor in a backplane substrate of a display device including the same.

Discussion of the Related Art

The development of various portable electronic appliances, such as mobile communication terminals and laptop computers, is increasing the demand for flat panel display devices that may be applied to such portable electronic appliances.

As examples of flat panel display devices, liquid crystal display devices, plasma display panel devices, field emission display devices, and organic or inorganic light emitting diode display devices are being studied. Among these examples of flat panel display devices, the application fields of liquid crystal display devices and organic light emitting diode display devices are expanding owing to several advantages including the development of mass production technology, ease in driving means, low power consumption, and the realization of high resolution and a large screen.

The flat panel display devices described above may include a plurality of pixels arranged in a matrix with one or more thin film transistors (TFTs) provided in each pixel so as to individually control the corresponding pixel. The thin film transistors may be categorized as a top gate type or a bottom gate type based on the position of a gate electrode.

FIG. 1 is a cross sectional view illustrating a typical top gate type TFT after the formation of a gate electrode. In the typical top gate type TFT, amorphous silicon layer is first formed on a substrate 10, and is crystallized using an excimer laser so as to form polysilicon.

Subsequently, a photosensitive film (not illustrated) is applied on the crystallized polysilicon, and is then subjected to exposure and developing processes to form a photosensitive film pattern. As the polysilicon is etched using the photosensitive film pattern as a mask, as illustrated in FIG. 1, an active layer 20 remains at a designed location on each pixel.

However, the above crystallization is typically conducted at a temperature of 400° C. or more. In this process, protrusions may be formed at the locations at which grains grown in the active layer 20 meet each other. Once the thin film transistor is formed in this manner and the power is applied to it, an electric field may be concentrated at the protrusions, which may undesirably reduce a breakdown voltage, thus causing an undesired leakage of current. In addition, during the manufacture process, the protrusions make the thin film transistor more vulnerable to electrostatic defects, thus causing a reduction in the production yield. This disadvantage may be exacerbated when the thickness of a gate insulating layer is reduced in newer generation of devices in the interests of realizing low power consumption and a slim design.

After the active layer 20 is formed in the typical top gate type TFT, a gate insulating layer 30 and a gate electrode 40 are formed in sequence. In this case, the gate insulating layer 30 and the gate electrode 40 cover the protrusions of the active layer 20. Thus, the protrusions formed on the surface of the active layer 20 result in protrusions at the respective interfaces of the gate insulating layer 30 and the gate electrode 40.

The active layer 20 has a channel formed in a portion thereof that overlaps the gate electrode 40. The gate insulating layer 30 is interposed between the active layer 20 and the gate electrode 40. Thus, the channel is formed at a non-uniform interface between the active layer 20 and the gate insulating layer 30 caused by the protrusions at the surface of the active layer 20 described above. This may lead to high hot carrier stress (HCS), resulting in deterioration in reliability.

SUMMARY OF THE INVENTION

Accordingly, the present invention is directed to a thin film transistor and a backplane substrate for a display device including the same that substantially obviate one or more problems due to limitations and disadvantages of the related art.

An object of the present invention is to provide a thin film transistor, which prevents or reduces disconnection of an active layer caused at the time of the crystallization the active layer by changing the position of a gate electrode and/or adjusting the gradient of the gate electrode, and a backplane substrate for a display device including the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the present invention, as embodied and broadly described herein, a thin film transistor comprises: a substrate; a gate electrode on the substrate, the gate electrode including a flat portion and an inclined portion at a side of the flat portion, a ratio of a height to a width (height/width) of the inclined portion being 1.192 or less; a gate insulating layer disposed on the substrate to cover the gate electrode; a polysilicon active layer on the gate insulating layer and over the gate electrode; and a source electrode and a drain electrode respectively connected to two opposite end portions of the polysilicon active layer.

In another aspect of, a backplane substrate of a display device comprises: a substrate having a plurality of pixels arranged in a matrix, wherein at least one of the pixels includes a gate electrode on the substrate, the gate electrode including a flat portion and an inclined portion at a side of the flat portion, a ratio of a height to a width (height/width) of the inclined portion being 1.192 or less; a gate insulating layer disposed on the substrate to cover the gate electrode; a polysilicon active layer disposed on the gate insulating layer and over the gate electrode; and a source electrode and a drain electrode respectively connected to two opposite end portions of the polysilicon active layer.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE EXAMPLE EMBODIMENTS

Reference will now be made in detail to the example embodiments of the present invention, which are illustrated in the accompanying drawings.

As described above, a typical top gate type thin film transistor (TFT) may have a problem in that protrusions are formed on the surface of an active layer, which may cause high hot carrier stress and may also lead to the formation of a channel and the concentration of an electric field near the protrusions, resulting in a reduction in the breakdown voltage (BV).

In view of problems associated with the top gate type TFT, research and development into the bottom gate type TFT have recently been conducted with regard to the configuration in which an active layer is formed of polysilicon.

Figure 1:
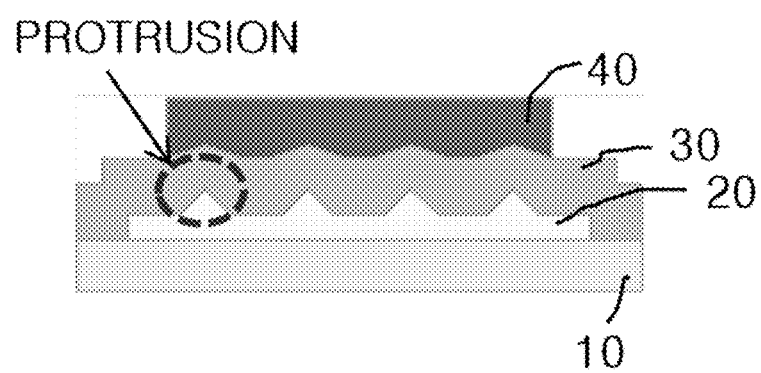
FIG. 1 is a cross sectional view illustrating a typical top gate type thin film transistor (TFT) after the formation of a gate electrode.
Figure 2:
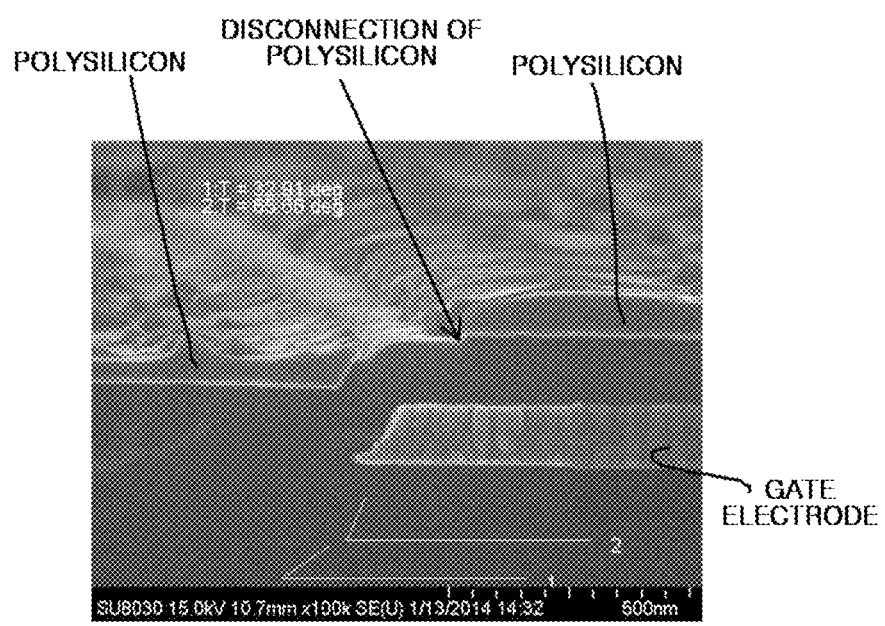
FIG. 2 is a cross sectional view illustrating a bottom gate type TFT after the crystallization of an active layer.

FIG. 2 is a cross sectional view illustrating a bottom gate type TFT after the crystallization of an active layer. As illustrated in FIG. 2, in the bottom gate type thin film transistor (TFT), a gate electrode 110 is formed on a substrate 100. Subsequently, a gate insulating layer 120 and an amorphous silicon layer are deposited in sequence, for example, via plasma enhanced chemical vapor deposition (PECVD). Thereafter, the amorphous silicon layer is crystallized, for example, via excimer laser irradiation to form polysilicon layer 130.

Here, because the crystallization is performed after the deposition of the amorphous silicon layer, the gate insulating layer 120 and the amorphous silicon layer may be formed via sequential deposition without any annealing process between the depositions. Accordingly, even if protrusions are formed on the surface of the polysilicon layer 130 at locations at which grains meet each other upon crystallization, the electric field concentration phenomenon of the top gate type TFT does not occur because a channel is formed at the flat interface between the polysilicon layer 130 and the gate insulating layer 120 above the gate electrode 110.

In addition, because the channel is formed above the gate electrode 110, there are more design options, which is advantageous in implementing a high resolution structure. Also, in the backplane of a liquid crystal panel, for example, the gate electrode 110 may block the light introduced from a backlight so that a separate light shield layer below the active layer is no longer necessary to prevent or reduce an undesirable photocurrent. In the backplane of a passive organic light emitting diode display device, a bottom shield metal layer may be omitted, which may reduce the number of masks needed for fabricating the device.

However, in the bottom gate type TFT, during the formation of the polysilicon layer using excimer laser irradiation, an agglomeration phenomenon may occur, in which liquid-phase silicon is cooled, causing crystalline lumps to agglomerate together due to surface tension and gravity. Although this process does not affect a flat surface, the crystalline lumps may move to a tapered portion, such as the portions above the opposite ends of the gate electrode. Consequently, polysilicon may be lost from the inclined portion above the ends of the gate electrode.

Figure 3:
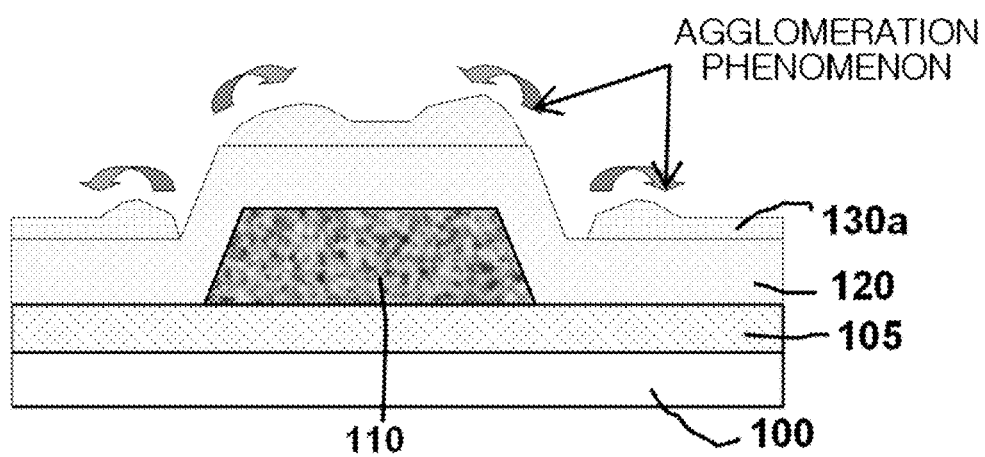
FIG. 3 is a cross sectional view illustrating a disconnection of the active layer during the cooling after the crystallization of the active layer in the bottom gate type TFT.
Figure 4:
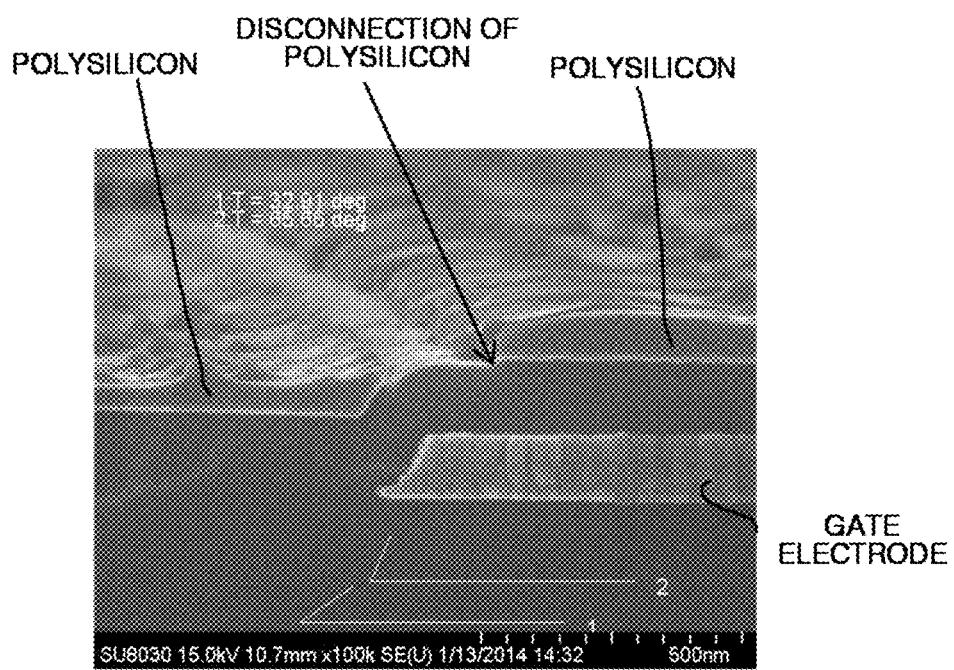
FIG. 4 is an SEM view illustrating the disconnection of the active layer of FIG. 3.

FIG. 3 is a cross sectional view illustrating a disconnection of the active layer during the cooling after the crystallization of the active layer in the bottom gate type TFT, and FIG. 4 is a scanning electron microscope (SEM) view illustrating the disconnection of the active layer of FIG. 3.

In FIG. 3, the disconnection of an active layer 130a, caused by the loss of polysilicon at the tapered portion after the cooling, is illustrated in cross section. FIG. 4 is an SEM view illustrating a captured image showing the loss of the polysilicon at the tapered portion. As illustrated, a disconnection of the active layer 130a occurs on the side surface of the gate insulating layer 120 along the tapered portion of the gate electrode 110. The active layer is polysilicon, which has been subjected to crystallization and cooling in that order.

An object of the present invention is to prevent or reduce the generation of defects in the tapered portion of the bottom gate type TFT in which polysilicon is formed via laser crystallization, as described below.

First Example Embodiment

Figure 5A:
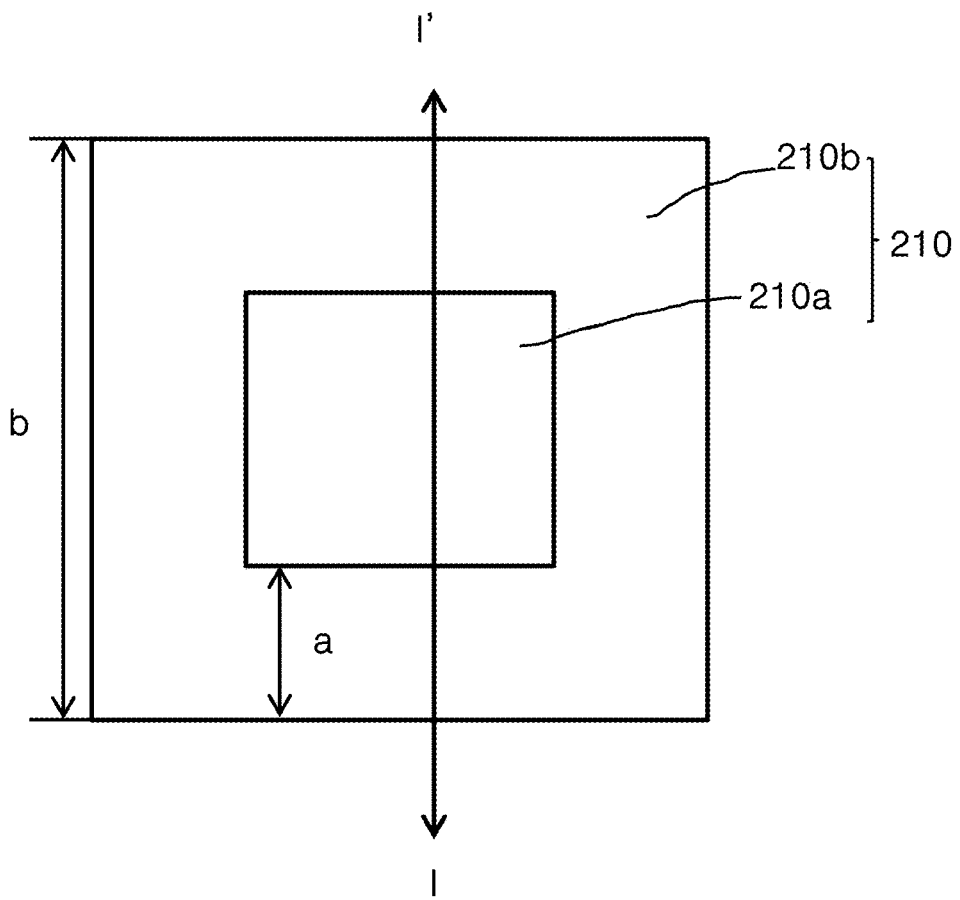
FIGS. 5A and 5B are respectively a plan view and a cross sectional view taken along line I-I' illustrating the state of various layers in the fabrication of a TFT immediately after the formation of a silicon layer in the TFT in accordance with a first example embodiment of the present invention.
Figure 5B:
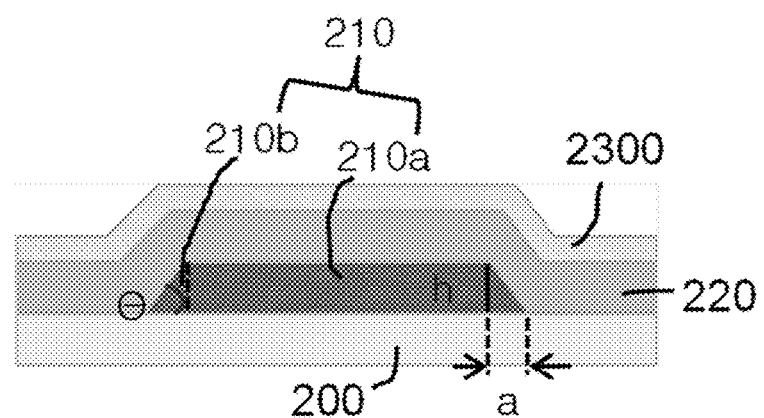
Figure 6:
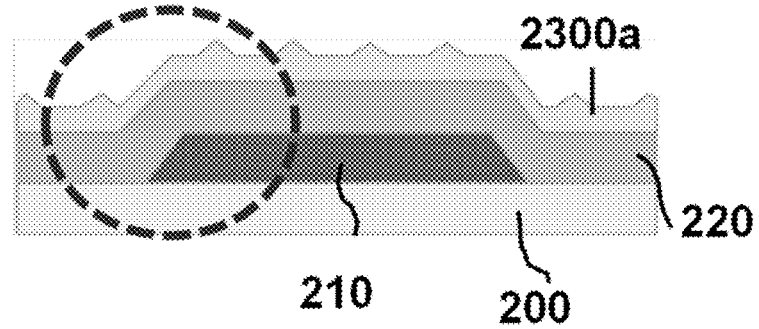
FIG. 6 is a cross sectional view (taken along the same location as line I-I' in FIG. 5A) illustrating the state of various layers in the fabrication of the TFT after the laser crystallization of the silicon layer in the TFT in accordance with the first example embodiment of the present invention.

FIGS. 5A and 5B are respectively a plan view and a cross sectional view taken along line I-I' illustrating the state of various layers in fabricating a thin film transistor immediately after the formation of a silicon layer in the thin film transistor in accordance with a first example embodiment of the present invention. FIG. 6 is a cross sectional view (taken along the same location as line I-I' in FIG. 5A) illustrating the state of various layers in fabricating the thin film transistor after the laser crystallization of the silicon layer in the thin film transistor in accordance with the first example embodiment of the present invention. In addition, FIG. 7 is a cross sectional view (taken along the same location as line I-I' in FIG. 5A) illustrating the thin film transistor in accordance with the first example embodiment of the present invention.

Figure 7:
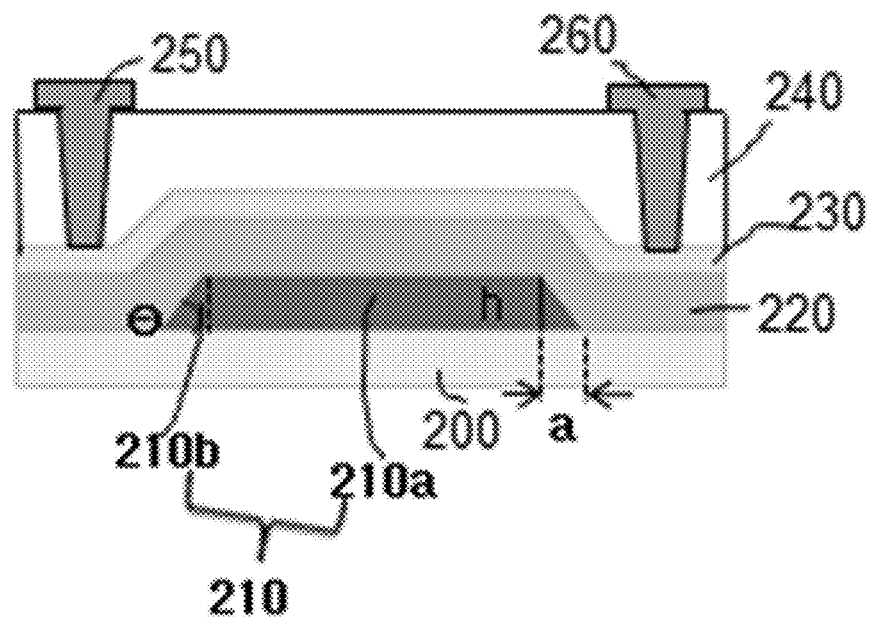
FIG. 7 is a cross sectional view (taken along the same location as line I-I' in FIG. 5A) illustrating the thin film transistor in accordance with the first example embodiment of the present invention.

As illustrated in FIGS. 5B and 7, the thin film transistor in accordance with the first example embodiment of the present invention includes a gate electrode 210, which is formed on a substrate 200 and includes a flat portion 210a and a surrounding inclined portion 210b. The ratio (h/a) of the height "h" to the width "a" of the inclined portion 210b is 1.192 or lower (i.e., angle θ of approximately 50° or less). The thin film transistor also includes a gate insulating layer 220 disposed on the substrate 200 to cover the gate electrode 210, a polysilicon active layer 230 disposed on the gate insulating layer 220 so as to correspond to the gate electrode 210, and a source electrode 250 and a drain electrode 260 respectively connected to opposite ends of the active layer 230.

Although the ratio of the height "h" to the width "a" of the inclined portion 210b may be set to approximately 1 or lower (i.e., angle θ of approximately 45° or less) in the design stage, a ratio of up to approximately 1.192 may be allowable in view of a tolerance of approximately 10% in a final product. If the ratio is converted into the angle of the inclined portion 210b, although the target angle θ is 45° or less in the design stage, the angle θ of up to approximately 50° may be considered acceptable in the final product in view of such a tolerance.

The opposite ends of the active layer 230 are doped to define a source area and a drain area at either side of a channel area, respectively. The source and drain areas are for connection with the source electrode 250 and/or the drain electrode 260, respectively. The channel area may be defined in accordance with the position of the gate electrode 210. In addition, the intrinsic area of the active layer 230 between the source area and the drain area may be used as the channel area of the thin film transistor.

An interlayer insulator film 240 may be formed as an interlayer between the active layer 230 on one hand, and the source electrode 250 and the drain electrode 260 on the other. The source and drain electrodes 250, 260 may be respectively connected to the source and drain regions of the active layer 230 via respective contact holes through the interlayer insulator film 240.

The thin film transistor in accordance with the first example embodiment of the present invention has a reduced gradient of the inclined portion of the gate electrode 210. As illustrated in FIGS. 5A and 5B, the angle θ between the inclined portion 210b and the surface of the substrate 200 may be within the range from 2° to 50°. Herein, the upper limit 50° is determined so the overlapping polysilicon layer with the gate electrode cannot be disconnected. As the angle θ between the inclined portion 210b and the surface of the substrate 200 is smaller, it is effective to prevent disconnection of the polysilicon layer, however the smaller angle means increased inclined portion and decreased flat portion. Since decreased flat portion causes increasing resistance of the gate electrode, the angle θ between the inclined portion 210b and the surface of the substrate 200 should be more than 2° to remain the flat portion as an enough width. Here, the angle θ of the inclined portion 210b relative to the surface of the substrate 200 may be changed within the range of a process tolerance of the final product. The reason for the inclined portion 210b having a low gradient is so that, upon deposition over the surface of the gate electrode 210, the amorphous silicon 2300 may be deposited at a gentle gradient on the inclined portion 210b of the gate electrode 210 in addition to being flat on the flat portion 210a of the gate electrode 210. In addition, as illustrated in FIG. 6, even if protrusions are formed on the surface of polysilicon layer 2300a during the crystallization process at approximately 400° C. via laser irradiation and the crystallized components partially agglomerate together during the cooling process after the crystallization, no disconnection of the polysilicon layer 2300a occurs because the polysilicon layer 2300a is deposited at a gentle gradient over the inclined portion 210b.

FIG. 6 illustrates the polysilicon layer 2300a, which has been subjected to laser irradiation and cooling but has not been patterned. In the case of an actual thin film transistor or a backplane substrate for a display using the same, the polysilicon layer 2300a is patterned so that only a given portion thereof remains as the active layer 230 (see, e.g., FIG. 7).

Figure 8A:
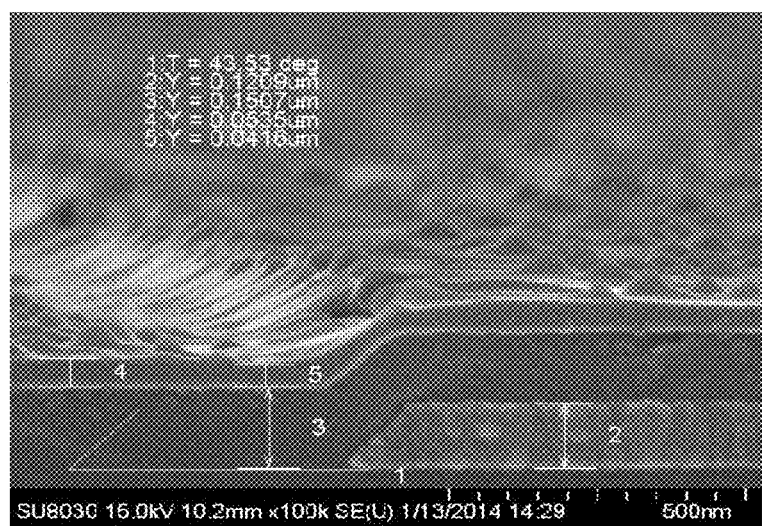
FIGS. 8A to 8C are SEM views illustrating the state of various layers in fabricating of the TFT after the crystallization of FIG. 6 when the angle of the inclined portion of a gate electrode is 45°, 30° or 10°, respectively.
Figure 8B:
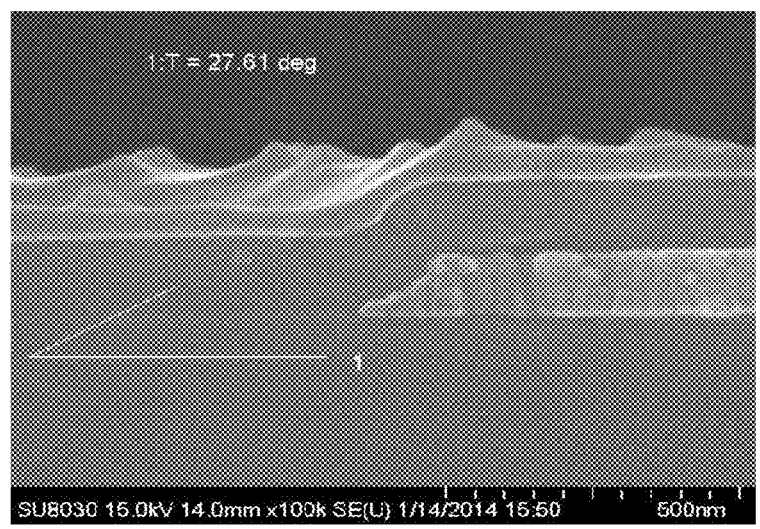
Figure 8C:
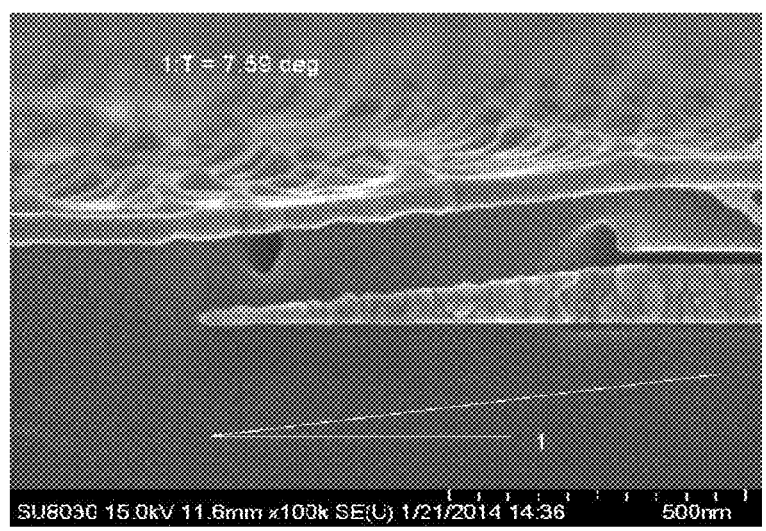

Hereinafter, an experiment showing that a disconnection does not occur at the inclined portion of polysilicon when the inclined portion of the gate electrode 210 has a low gradient will be described. FIGS. 8A to 8C are SEM views illustrating the state of various layers in fabricating the thin film transistor after the crystallization of FIG. 6 when the angle θ of the inclined portion of the gate electrode 210 is 45°, 30° or 10° respectively.

FIGS. 8A to 8C each illustrate the top of the gate electrode after the process of laser irradiation for the crystallization of amorphous silicon and the process of cooling have been conducted in that order. As illustrated, there is no disconnection at the inclined portion of the polysilicon layer when the target angle of the inclined portion of the gate electrode is 45° or less. The angle of the inclined portion of the gate electrode remaining in the final product with respect to the flat substrate may, in practice, be approximately 50° or less due to a process tolerance.

Although the bottom gate type TFT has recently been studied with a goal of reducing the thickness of the gate (electrode) to below 1000 Å while maintaining a high gradient thereof in an attempt to reduce a tapered portion, the bottom gate type TFT has an increased probability of causing a disconnection in the polysilicon layer over the inclined portion of the gate electrode when the thickness of the gate (electrode) is 1000 Å or more. FIG. 4 illustrates an experimental case where the inclined portion of the gate electrode has a high gradient and the angle between the inclined portion of the gate electrode and the substrate is approximately 65°. In this case, as illustrated in FIG. 4, a disconnection in the polysilicon layer over the inclined portion of the gate electrode is observed.

The thin film transistor according to the example embodiments of the present invention solves the problem described above by reducing the angle of the inclined portion of the gate electrode with respect to the underlying substrate. In other words, according to the example embodiments of the present invention, even if the thickness of the flat portion of the gate electrode is 1000 Å or more, disconnection of polysilicon on the inclined portion of the gate electrode will not occur. Because the two end portions of the gate electrode has lower taper, separation of crystalline is nearly happened where overlapping polysilicon layer with the two end portion of the gate electrode during annealing and cooling processes.

Hereinafter, a method of forming the gate electrode having a low gradient for the thin film transistor according to the first example embodiments of the present invention will be described. FIGS. 9A to 9D are cross sectional views (taken along the same location as I-I' in FIG. 5A) illustrating a method of forming the gate electrode of the thin film transistor in accordance with the first example embodiment of the present invention.

Figure 9A:
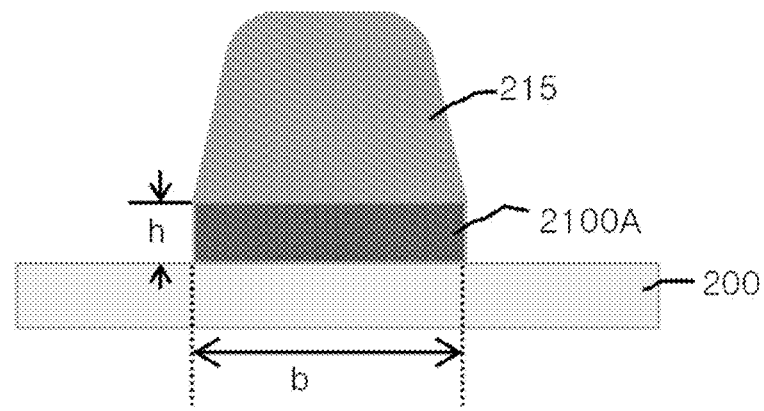
FIGS. 9A to 9D are cross sectional views (taken along the same location as line I-I' in FIG. 5A) illustrating a method of forming the gate electrode of the thin film transistor in accordance with the first example embodiment of the present invention.

As illustrated in FIG. 9A, a metal is first deposited on the substrate 200, and a first gate pattern layer 2100A is formed by wet etching or dry etching the deposited metal using a first photosensitive film pattern 215. Here, the first photosensitive film pattern 215 has a width "b", which corresponds to a flat portion and a surrounding inclined portion to be formed (see, e.g., FIG. 5A). In addition, the metal deposited on the substrate 200 has a thickness "h", which may be 1000 Å or more. The metal may be of a single layer formed of the same metal or the same metal alloy deposited via, for example, sputtering.

Figure 9B:
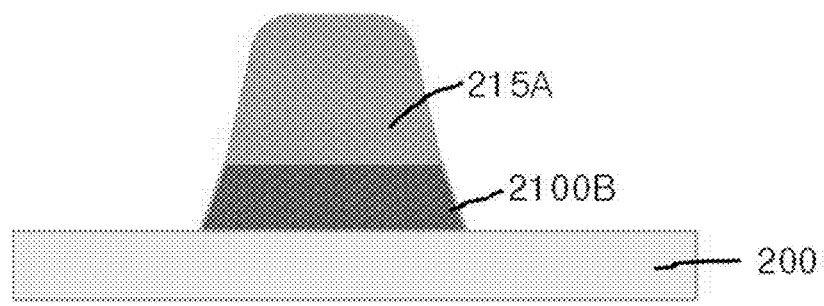

As illustrated in FIG. 9B, the content of oxygen ($O_2$) in an etching apparatus is increased, and a second photosensitive film pattern 215A is formed by ashing the first photosensitive film pattern 215 primarily to reduce the width of the photo sensitive film pattern 215. In the same process, the side portion of the first gate pattern layer 2100A is etched at an angle to form a second gate pattern layer 2100B having a first gradient.

Figure 9C:
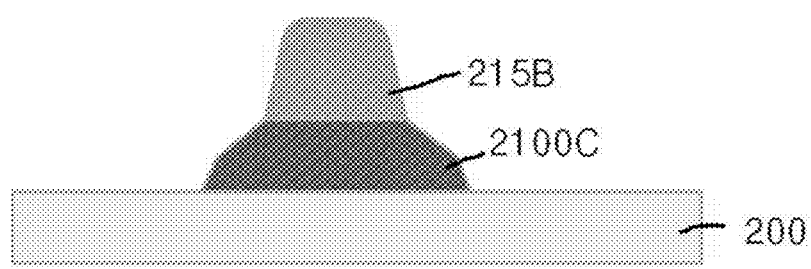

Subsequently, as illustrated in FIG. 9C, with the content of oxygen ($O_2$) in the etching apparatus increased, a third photosensitive film pattern 215B is formed by ashing the second photosensitive film pattern 215A so as to further reduce the width of the second photosensitive film pattern 215A. In the same process, the side portion of the second gate pattern layer 2100B is further etched to form a third gate pattern layer 2100C having a second gradient. The dry etching plasma used in this process has a photosensitive component, the etching selectivity of which is greater than the etching selectivity of the metal for the formation of the gate electrode. Therefore, a relatively large amount of the second photosensitive film pattern 215A may be removed to form the third photosensitive film 215B in the ashing and etching processes. In addition, the lower end of the third gate pattern layer 2100C may be maintained at the width "b" obtained in the process of FIG. 9A. Further, the resulting third gate pattern layer 2100C may include an upper portion and a lower portion, which are tapered at different gradients.

Figure 9D:
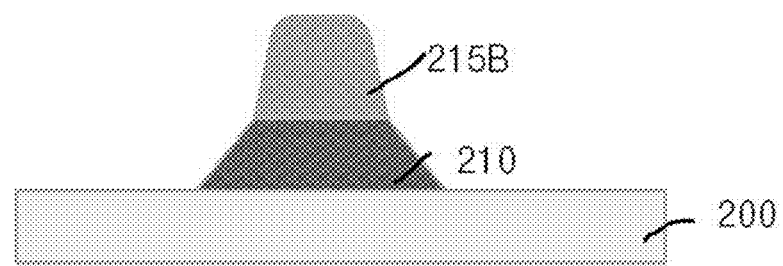

Subsequently, as illustrated in FIG. 9D, as the process time is increased under the same conditions as those in FIG. 9C, a portion of the gate electrode 210 immediately below the third photosensitive film pattern 215B is etched. As a result, the gate electrode 210 is ultimately tapered at the ends approximately at a constant second gradient, which is lower than the first gradient.

The sequential processes illustrated in FIGS. 9A to 9D may be performed in the same plasma etching apparatus. The amount of oxygen may be increased when ashing of the photosensitive film pattern is required. The etching of the metal gate pattern layer below the ashed photosensitive film pattern may be performed using dry etching plasma. The etching selectivity of the photosenstive film may be higher than the etching selectivity of the metal, such that the etching process slowly proceeds starting from the upper portion of the metal gate pattern layer, to which the dry etching plasma is directly applied. This allows the gate pattern layer to be tapered at a low gradient. In addition, the dry etching plasma may be supplied to the substrate 200 from the top side of the photosensitive film pattern.

With the example method described above, the gate electrode 210 may be formed with a single metal layer having a low-gradient inclined portion by controlling, for example, the etching selectivity of the photosensitive film after first depositing the gate metal once, rather than being formed as multiple layers or in divided parts made of different kinds of metals.

Second Embodiment

Figure 10A:
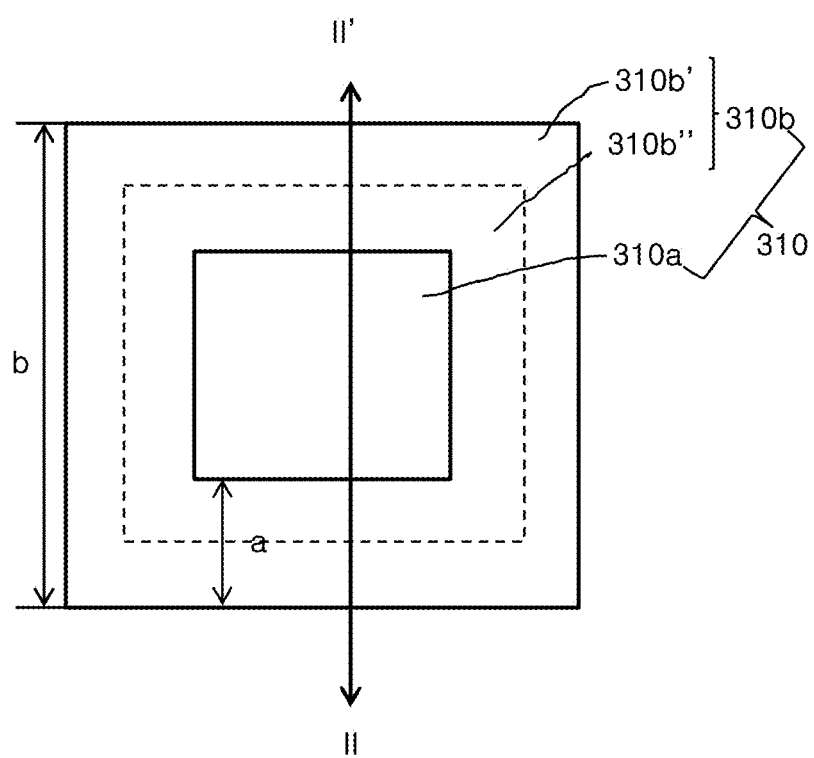
FIGS. 10A and 10B are respectively a plan view and a cross sectional view taken along line II-II' illustrating the state of various layers in fabricating a thin film transistor immediately after the formation of a silicon layer in the thin film transistor in accordance with a second example embodiment of the present invention.
Figure 10B:
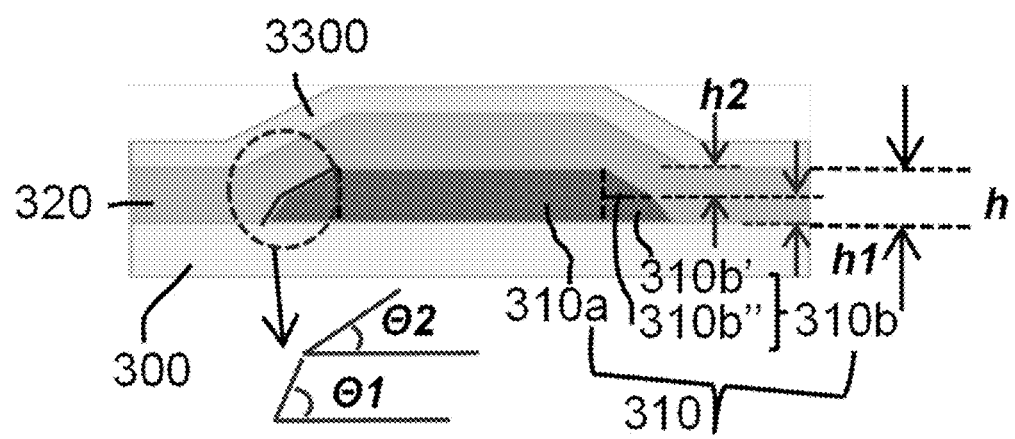
Figure 11:
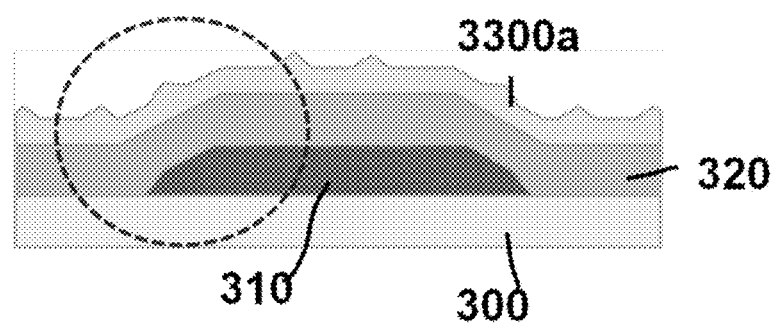
FIG. 11 is a cross sectional view (taken along the same location as line II-II' in FIG. 10A) illustrating the state of various layers in fabricating the thin film transistor after the laser crystallization of the silicon layer in the thin film transistor in accordance with the second example embodiment of the present invention.
Figure 12:
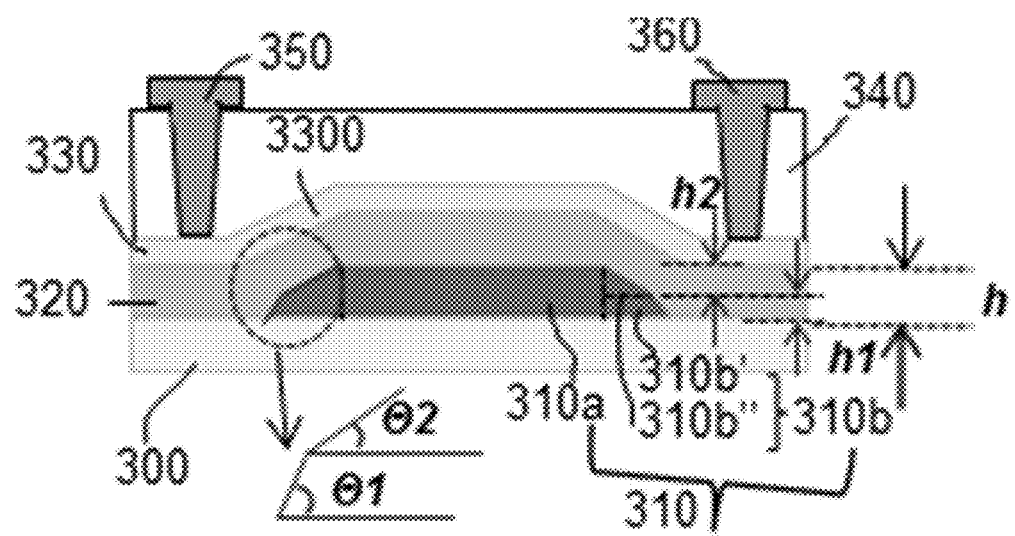
FIG. 12 is a cross sectional view (taken along the same location as line II-II' in FIG. 10A) illustrating the thin film transistor in accordance with the second example embodiment of the present invention.

FIGS. 10A and 10B are respectively a plan view and a cross sectional view taken along line II-II' illustrating the state of various layers of a thin film transistor immediately after the formation of a silicon layer in the thin film transistor in accordance with a second example embodiment of the present invention. FIG. 11 is a cross sectional view (taken along the same location as line illustrating the state of various layers of the thin film transistor after the laser crystallization of the silicon layer in the thin film transistor in accordance with the second example embodiment of the present invention. FIG. 12 is a cross sectional view (taken along the same location as line II-II') illustrating the thin film transistor in accordance with the second example embodiment of the present invention.

As illustrated in FIG. 12, the thin film transistor in accordance with the second example embodiment of the present invention includes a gate electrode 310, which is formed on a substrate 300. The gate electrode 310 includes a flat portion 310a and a surrounding inclined portion 310b, the ratio (h/a) of the total height "h" to the total width "a" of the inclined portion 310b (see, e.g., FIG. 10A) being 1.192 or less. The thin film transistor also includes a gate insulating layer 320, which is disposed on the substrate 300 so as to cover the gate electrode 310, a polysilicon active layer 330, which is disposed on the gate insulating layer 320 so as to cover the gate electrode 310, and a source electrode 350 and a drain electrode 360 respectively connected to two opposite ends of the active layer 330.

Here, unlike the first example embodiment, the inclined portion 310b of the gate electrode 310 is dually tapered as illustrated, for example, in FIGS. 10A and 10B. That is, the inclined portion 310b includes a first inclined portion 310b', which is formed close to the substrate 300 and has a first thickness "h1" and a first angle "θ1" relative to the substrate 300, and a second inclined portion 310b", which is formed on the first inclined portion 310b' and has a second thickness "h2" and a second angle "θ2" relative to the substrate 300. The first angle θ1 may be greater than the second angle θ2. In other words, the upper portion of the inclined portion 310b may have a higher etching degree. In this case, the second angle θ2 may be within the range from about 2° to about 50°, and the second inclined portion 310b" having the second angle θ2 may occupy half or more of the thickness of the entire inclined portion 310b. Accordingly, the first inclined portion 310b' may make up less than half of the thickness of the entire inclined portion 310b, and its thickness "h1" may be less than half of the thickness "h" of the flat portion 310a.

The opposite ends of the active layer 330 are doped to define a source area and a drain area at either side of a channel area for connection with the source electrode 350 and/or the drain electrode 360, respectively. The channel area may be defined according to the gate electrode 310. In addition, the intrinsic area of the active layer 330 between the source area 330 and the drain area 330 may be used as the channel area of the thin film transistor.

An interlayer insulator film 340 may be formed as an interlayer between the active layer 330 on one hand, and the source electrode 350 and the drain electrode 360 on the other. The source and drain electrodes 350, 360 may be connected to the source and drain areas of the active layer 330 via respective contact holes through the interlayer insulator film 340.

Figure 13A:
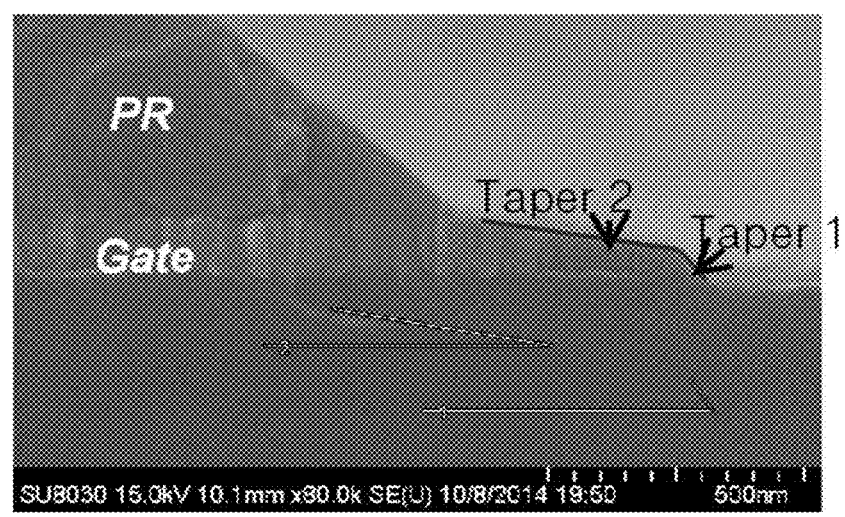
FIGS. 13A and 13B are SEM views respectively illustrating the state of various layers in fabricating the thin film transistor after the formation of a gate electrode and the state of thin film transistor after the formation of an active layer on the gate electrode in the thin film transistor in accordance with the second example embodiment of the present invention.
Figure 13B:
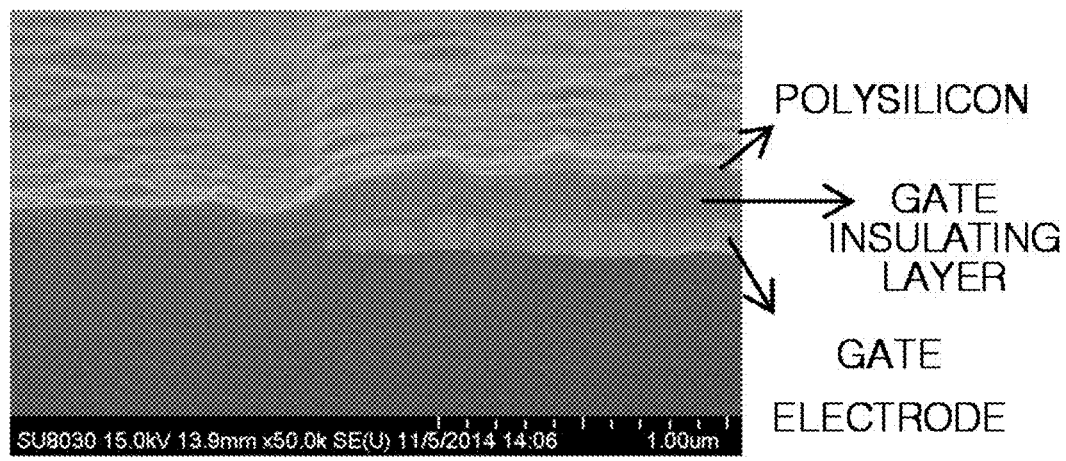

FIGS. 13A and 13B are SEM views respectively illustrating the state of various layers of the thin film transistor immediately after the formation of the gate electrode including the dually tapered inclined portion and the state of various layers of the thin film transistor after the formation and crystallization of the silicon layer on the gate electrode.

Figure 14A:
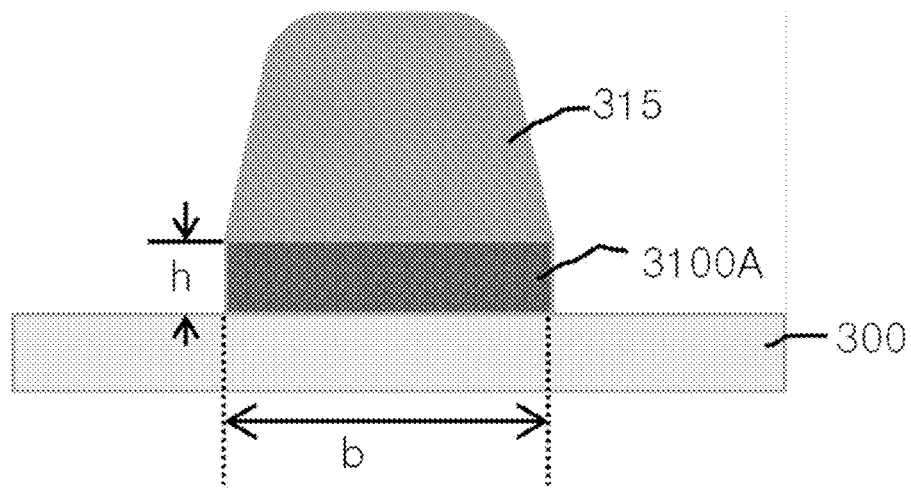
FIGS. 14A to 14C are cross sectional views (taken along the same location as line II-II' in FIG. 10A) illustrating a method of forming the gate electrode of the thin film transistor in accordance with the second example embodiment of the present invention.
Figure 14B:
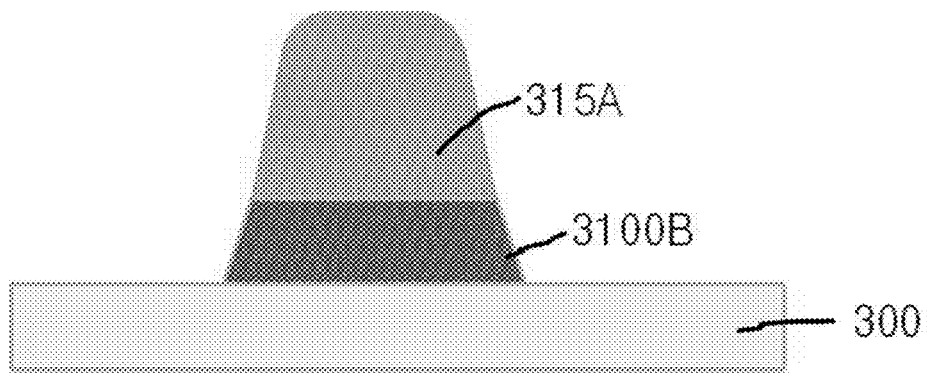
Figure 14C:
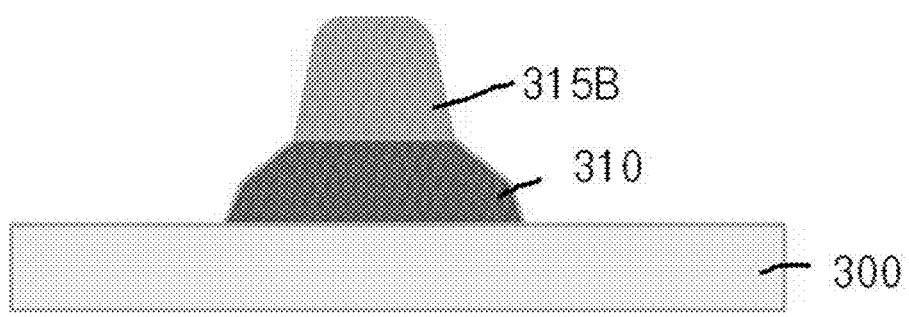

As illustrated in FIGS. 13A and 14C, a photosensitive film pattern 315B, which is used for patterning the gate electrode 310, remains immediately after the gate electrode 310 is formed. The width of the remaining gate photosensitive film pattern 315B approximately corresponds to the width of the flat portion 310a of the gate electrode 310. In addition, as shown in FIG. 10A, the inclined portion 310b around the flat portion 310a of the gate electrode 310 has a width "a". As shown in FIGS. 10A, 10B, and 12, the inclined portion 310b includes the first inclined portion 310b' having a relatively high gradient and the second inclined portion 310b" having a relatively low gradient.

After the photosensitive film pattern 315B is removed from the gate electrode 310, the gate insulating layer 320 and an amorphous silicon layer 3300 are sequentially deposited on the substrate 300 to cover the top of the gate electrode 310. Thereafter, the amorphous silicon layer 3300 is crystallized, for example, via laser irradiation, and is then cooled to form a polysilicon layer 3300a, as illustrated in FIG. 11. Even if crystalline lumps of the polysilicon layer 3300a agglomerate together during cooling, as illustrated in FIG. 13B, almost no polysilicon is lost, even from the inclined portion of the polysilicon layer 3300a, because the inclined portion mainly has a low gradient. In this way, no disconnection occurs in the polysilicon layer 3300a.

Then, the polysilicon layer 3300a is patterned into a specific shape, and is subsequently doped at the opposite end portions the patterned shape to form the active layer 330.

The active layer 330 includes a source area and a drain area at either sides and an intrinsic area over the gate electrode 310 and between the source area and the drain area to function as a channel, as illustrated in FIG. 12.

Hereinafter, a method of forming the gate electrode having the dually tapered inclined portion in accordance with the second example embodiment of the present invention will be described. FIGS. 14A to 14C are cross sectional views (taken along the same location as line II-II') illustrating a method of forming the gate electrode of the thin film transistor in accordance with the second example embodiment of the present invention.

As illustrated in FIG. 14A, a metal is first deposited on the substrate 300, and a first gate pattern layer 3100A is formed by wet etching or dry etching the deposited metal using a first photosensitive film pattern 315. Here, the first photosensitive film pattern 315 has a width "b", which corresponds to a flat portion and a surrounding inclined portion of the gate electrode 310 to be formed (see, e.g., FIG. 10A). In addition, the metal deposited on the substrate 300 may have a thickness "h" of 1000 Å or more. The metal may be of a single layer formed of the same metal or the same metal alloy deposited via, for example, sputtering.

As illustrated in FIG. 14B, with the increased content of oxygen ($O_2$) in an etching apparatus, a second photosensitive film pattern 315A is formed by ashing the first photosensitive film pattern 315 primarily to reduce the width of the first photosensitive film pattern 315. In the same process, the first gate pattern layer 3100A is etched at the side portions to form a second gate pattern layer 3100B having a first gradient, which is the gradient of a first inclined portion 310b' (see, for example, FIG. 12).

In this process, more of the upper portion of the first gate pattern layer 3100A is removed than the lower portion of the first gate pattern layer 3100A in forming the second gate pattern layer 3100B because the first photosensitive film pattern 315 is reduced in width by ashing to form the second photosensitive film pattern 315A. It is also because dry etching plasma, introduced from the top side of the etching apparatus, is directly applied to the upper portion of the first gate pattern layer 3100A, which is exposed through the second photosensitive film pattern 315A, and thus greatly reacts therewith.

Subsequently, as illustrated in FIG. 14C, with the content of oxygen ($O_2$) in the etching apparatus increased, a third photosensitive film pattern 315B is formed by ashing the second photosensitive film pattern 315A so as to further reduce the width of the second photosensitive film pattern 315A. In the same process, the second gate pattern layer 3100B is etched at the side portions to form a gate electrode 310 as a third gate pattern layer having the a first gradient and a second gradient. The dry etching plasma used in this process has a photosensitive component, the etching selectivity of which is greater than the etching selectivity of the metal deposited for the formation of the gate electrode. Therefore, a relatively large amount of the third photosensitive film pattern 315B may be removed in the ashing and etching processes. In addition, the lower end of the resulting gate electrode 310 may be maintained at the width "b" obtained in the process of FIG. 14A. In addition, the resulting gate electrode 310 may include the first inclined portion 310b' and the second inclined portion 310b", which are tapered at different gradients. Thus, the completed gate electrode 310 of FIG. 12 includes the flat portion 310a and the surrounding inclined portion 310b, which is dually tapered at different gradients, in accordance with the second example embodiment of the present invention.

The sequential processes illustrated in FIGS. 14A to 14C may be performed in the same plasma etching apparatus. The amount of oxygen in the etching apparatus may be increased when ashing of the photosensitive film pattern is required. The gate pattern layer below the ashed photosensitive film pattern may be etched using dry etching plasma. The etching selectivity of the photosenstive film may be higher than the etching selectivity of the gate metal, such that etching is more actively performed in the upper portion of the gate pattern layer.

With the method described above, the gate electrode 310 may be formed as a single layer having a dually tapered portion, which includes the second inclined portion 310b" having a relatively low gradient and the first inclined portion 310b' having a smaller thickness than that of the second inclined portion 310b", by controlling, for example, the etching selectivity of the photosensitive film after first depositing the gate metal once, rather than being formed as multiple layers or in divided parts made of different kinds of metals.

One or more of the thin film transistors in accordance with the first example embodiment or the second example embodiment of the present invention described above may be provided in each of the pixels in a matrix on a substrate so as to form a backplane substrate of a display device. For example, in the case of a liquid crystal panel, each pixel may be provided with the thin film transistor, which is configured such that the polysilicon active layer, crystallized via laser irradiation, is formed on the gate electrode having a low-gradient inclined portion as described above. A pixel electrode may further be provided so as to be connected to the drain electrode among the source electrode and the drain electrode, which are respectively connected to opposite ends of the active layer. As a result, the thin film transistors of the respective pixels may be selectively driven in a pixel-by-pixel manner to display a gray scale image.

In addition, in the case of an organic light emitting diode display panel, each pixel may incorporate two or more thin film transistors, which are configured such that the polysilicon active layer, crystallized via laser irradiation, is formed on the gate electrode having a low-gradient inclined portion as described above. Each pixel may further incorporate an organic light emitting diode, which includes two electrodes and an organic light emitting layer therebetween. The drain electrode of the thin film transistor among the source electrode and the drain electrode, which are respectively connected to opposite ends of the active layer, may function as a first electrode of the organic light emitting diode. As a result, the thin film transistors of respective pixels may be selectively driven in a pixel-by-pixel manner to display a gray scale image.

As is apparent from the above description, a thin film transistor and a backplane substrate for a display device including the same in accordance with the present invention have at least the following advantages.

First, as a result of forming an active layer including a channel on a gate electrode, even if protrusions are formed on the upper surface of the active layer when the active layer is cooled after laser crystallization, the channel is formed at the flat interface between the active layer close to the gate electrode and a gate insulating layer. This reduces hot carrier stress, and thus prevents or reduces deterioration in the breakdown voltage (BV), resulting in improved device reliability. Accordingly, when the thin film transistor having the above-described configuration is provided on each pixel of a backplane substrate of a display apparatus, the overall performance of the display apparatus may be improved.

Second, as a result of positioning the gate electrode below the active layer, a separate light shield layer or a separate bottom shield metal layer, which is typically provided to prevent the generation of photocurrent, may be omitted. In this way, the number of masks and the processing steps used in the manufacturing process may be reduced. As a result, the production yield may be improved.

Third, in the case where the gate electrode has a thickness of a given amount or greater in order to reduce the resistance of wires, the gate insulating layer and the active layer deposited over the gate electrode are formed so as to have the same or similar gradient as that of the underlying gate electrode formed with inclined sides. In this case, by providing the inclined portion or portions of the gate electrode with a low gradient, a disconnection of the polysilicon active layer at the inclined portion may be prevented.

Fourth, the gate electrode may be provided with a low-gradient inclined portion or a dually tapered portion by controlling the ashing degree and the etching selectivity of a photosensitive film during the etching process without forming a plurality of metal layers and without adding a separate mask. This may reduce the process steps, simplify the manufacturing process, and reduce the manufacturing cost.

It will be apparent to those skilled in the art that various modifications and variations can be made in the thin film transistor and a backplane substrate of a display device including the same as disclosed herein without departing from the spirit or scope of the invention. Thus, it is intended that the present invention cover the modifications and variations of the disclosed example embodiments provided they come within the scope of the appended claims and their equivalents.

What is claimed is:

1. A thin film transistor comprising:
   a substrate;
   a gate electrode on the substrate, the gate electrode including a flat portion and an inclined portion at a side of the flat portion;
   a single gate insulating layer disposed on the substrate to cover the gate electrode, wherein a thickness of the single gate insulating layer is below 2000 Å;
   a polysilicon active layer directly on the single gate insulating layer and over the gate electrode; and
   a source electrode and a drain electrode respectively connected to two opposite end portions of the polysilicon active layer,
   wherein the end portions of the polysilicon active layer are beyond an outside of the gate electrode,
   wherein the flat portion and the inclined portion of the gate electrode are integrally formed of a single metal,
   wherein the polysilicon active layer has crystalline protrusions on an upper surface which is not in contact with the single gate insulating layer,
   wherein the crystalline protrusions protrude upwards where grains meet each other upon crystallization, and the crystalline protrusions extend to the end portions of the polysilicon active layer on the upper surface which is not in contact with the single gate insulating layer,
   wherein the inclined portion includes:
      a first inclined portion disposed close to the substrate, a tapered surface of the first inclined portion having a first angle relative to a surface of the substrate; and
      a second inclined portion on the first inclined portion, a tapered surface of the second inclined portion having a second angle relative to the surface of the substrate, wherein the second angle is greater than 2° and below 50°, and wherein the flat portion has a thickness equal to the height of the inclined portion, and the thickness is at least 1000 Å.

2. The thin film transistor according to claim 1, wherein the single gate insulating layer and the polysilicon active layer each cover the flat portion and the inclined portion of the gate electrode.

3. The thin film transistor according to claim 1, wherein the first angle is greater than the second angle.

4. The thin film transistor according to claim 1, wherein the first inclined portion has a thickness equal to or less than one half of a thickness of the flat portion.

5. The thin film transistor according to claim 1, wherein the thin film transistor (TFT) is a bottom gate type TFT, and
wherein the gate electrode has a configuration to prevent or reduce generation of defects in a portion of the polysilicon active layer formed over the inclined portion of the gate electrode via laser crystallization.

6. A bottom gate type thin film transistor, comprising:
a gate electrode on a substrate, the gate electrode having a flat portion and an inclined portion at a side of the flat portion;
a single gate insulating layer on the substrate covering the gate electrode;
a polysilicon active layer directly on the single gate insulating layer over the gate electrode; and
a source electrode and a drain electrode respectively connected to the polysilicon active layer,
wherein end portions of the polysilicon active layer are beyond an outside of the gate electrode
wherein the polysilicon active layer has crystalline protrusions on an upper surface which is not in contact with the single gate insulating layer,
wherein the crystalline protrusions protrude upwards where grains meet each other upon crystallization, and the crystalline protrusions extend to the end portions of the polysilicon active layer on the upper surface which is not in contact with the single gate insulating layer,
wherein the inclined portion includes:
a first inclined portion disposed close to the substrate, a tapered surface of the first inclined portion having a first angle relative to a surface of the substrate; and
a second inclined portion on the first inclined portion, a tapered surface of the second inclined portion having a second angle relative to the surface of the substrate,
wherein the second angle is greater than 2° and below 50°, and
wherein the flat portion has a thickness equal to the height of the inclined portion, and the thickness is at least 1000 Å.

7. The thin film transistor according to claim 6, wherein a configuration is achieved by the gate electrode made of a single metal having a flat portion and the inclined portion at an end of the flat portion, the inclined portion being a low-gradient inclined portion, thereby preventing a disconnection of the polysilicon active layer at the inclined portion without use of a plurality of metal layers.

8. The thin film transistor according to claim 7, wherein the low-gradient inclined portion is made by controlling an ashing degree and etching selectivity of a photosensitive film during an etching process of the gate electrode.

9. The thin film transistor according to claim 8, wherein the etching process of the gate electrode is performed sequentially in a same plasma etching apparatus.

10. The thin film transistor according to claim 8, wherein the etching process of the gate electrode is performed using dry etching plasma.

11. The thin film transistor according to claim 10, wherein the dry etching plasma is supplied to the substrate from a top side of the photosensitive film pattern.

12. The thin film transistor according to claim 6, wherein a height to width ratio of the inclined portion of the gate electrode is from 0.034 to 1.192.

13. The thin film transistor according to claim 6, wherein a thickness of the flat portion of the gate electrode is at least 1000 Å, and a thickness of the single gate insulating layer is below 2000 Å.

14. The thin film transistor according to claim 6, wherein the gate electrode performs as a light shield layer or a bottom shield metal layer to prevent generation of photocurrents.

15. The thin film transistor according to claim 7, wherein the polysilicon active layer covers the flat portion and the inclined portion of the gate electrode.

* * * * *